United States Patent
Zagrebelny et al.

(10) Patent No.: US 6,833,622 B1
(45) Date of Patent: Dec. 21, 2004

(54) SEMICONDUCTOR TOPOGRAPHY HAVING AN INACTIVE REGION FORMED FROM A DUMMY STRUCTURE PATTERN

(75) Inventors: Andrey V. Zagrebelny, Eagan, MN (US); Daniel J. Arnzen, Eden Praire, MN (US); Yitzhak Gilboa, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/375,534

(22) Filed: Feb. 27, 2003

(51) Int. Cl.[7] ............................................. H01L 23/48
(52) U.S. Cl. ..................... 257/752; 257/753; 257/758; 257/773; 257/776; 438/462; 438/393; 438/926; 438/975
(58) Field of Search ................................ 257/752, 753, 257/758, 773, 776, 903, 904, 523, 202, 203, 204, 205, 206, 208, 209, 210, 211, 501, 506, 509, 508, 296; 438/462, 393, 926, 975, 321, 183

(56) References Cited

U.S. PATENT DOCUMENTS

| | | | |
|---|---|---|---|
| 6,307,263 B1 | 10/2001 | Savignac et al. | |
| 6,396,123 B1 | 5/2002 | Nagaoka | |
| 6,461,941 B2 | 10/2002 | Kim | |
| 6,495,855 B1 * | 12/2002 | Sawamura | .................... 257/48 |
| 6,504,254 B2 | 1/2003 | Takizawa | |
| 2002/0031879 A1 * | 3/2002 | Itoh et al. | .................... 438/183 |
| 2002/0047164 A1 | 4/2002 | Ahn | |
| 2003/0034567 A1 * | 2/2003 | Sato et al. | .................. 257/786 |

* cited by examiner

Primary Examiner—Nathan J. Flynn
Assistant Examiner—Remmon R. Fordé
(74) Attorney, Agent, or Firm—Kevin L. Daffer; Mollie F. Leitang; Daffer McDaniel, LLP

(57) ABSTRACT

A dummy structure pattern for fabricating a substantially planar surface within an inactive region of a semiconductor topography is provided. In particular, a semiconductor topography is provided which includes an inactive region comprising a sacrificial annular dummy structure configured to surround an area larger than a square of a minimum critical dimension of a device arranged within an active region of the semiconductor topography. In a preferred embodiment, the area is exclusively designated for a formation of an isolation structure within the semiconductor substrate of the semiconductor topography. As such, a semiconductor topography is provided which includes a separate isolation structure arranged within a spacing of a contiguous isolation structure, which is arranged in a grid pattern within a portion of a semiconductor substrate. Moreover, a semiconductor device is provided which includes an inactive region with a plurality of similarly sized and uniformly arranged annular diffusion regions.

20 Claims, 4 Drawing Sheets

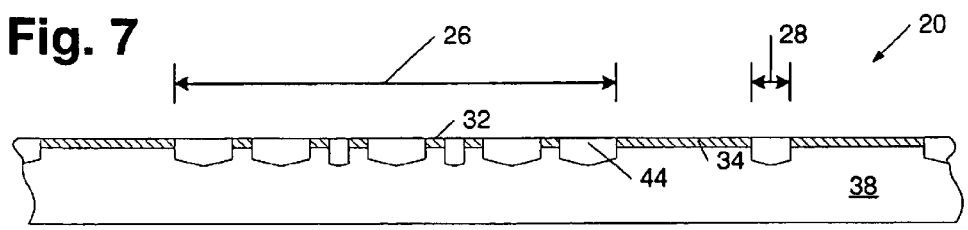
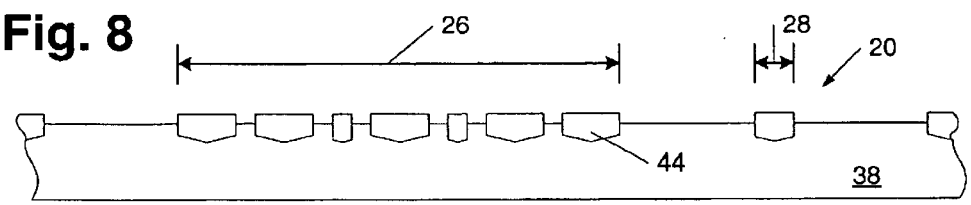
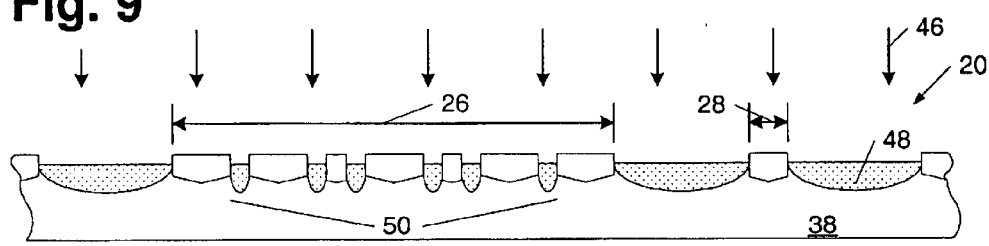
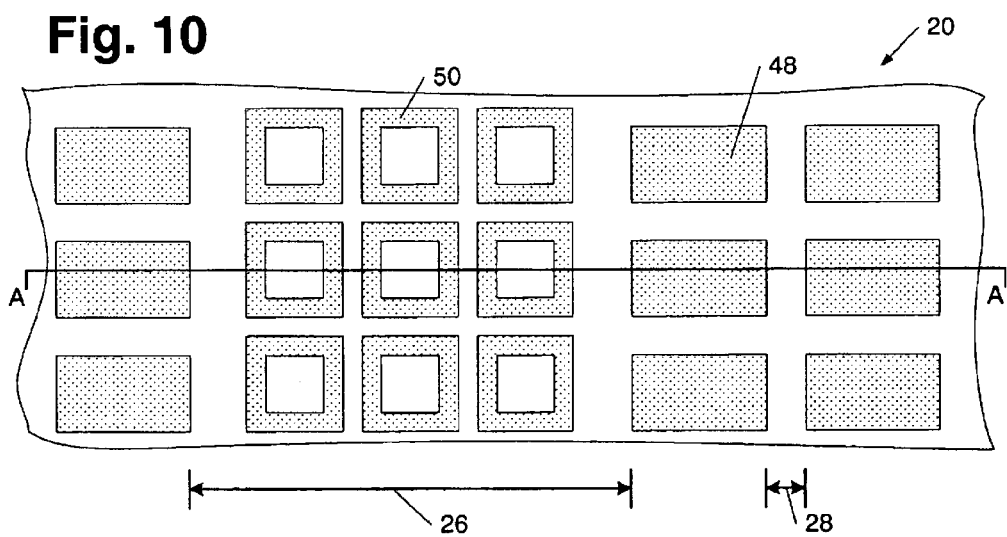

SEMICONDUCTOR TOPOGRAPHY HAVING AN INACTIVE REGION FORMED FROM A DUMMY STRUCTURE PATTERN

BACKGROUND OF THE INVENTION

1. Field of the Invention

This invention relates to semiconductor device manufacturing, and more particularly, to the formation of dummy structures within a semiconductor topography.

2. Description of the Related Art

The following descriptions and examples are not admitted to be prior art by virtue of their inclusion within this section.

Substantially planar surfaces within a semiconductor topography may play an important role in fabricating overlying layers and structures. For example, step coverage problems may arise when a material is deposited over a surface having raised and recessed regions. Step coverage is defined as a measure of how well a film conforms over an underlying step and is expressed by the ratio of the minimum thickness of a film as it crosses a step to the nominal thickness of the film over horizontal regions. Furthermore, correctly patterning layers upon a surface containing fluctuations in elevation may be difficult using optical lithography. The depth-of-focus of the lithography alignment system may vary depending upon whether the resist resides in an elevational "hill" or "valley" area. Furthermore, substantially planar surfaces may become increasingly important as the feature sizes of semiconductor devices are reduced, since the depth of focus required to pattern an upper surface of a topography may increase with reductions in feature size. If a topography is nonplanar, the patterned image may be distorted and the intended structure may not be formed to the specifications of the device.

A technique that is often used to planarize or remove the elevational fluctuations in the surface of a semiconductor topography is chemical mechanical polishing "CMP." A conventional CMP process may involve placing a semiconductor wafer face-down on a polishing pad which lies on or is attached to a table or platen. During the CMP process, the polishing pad and/or the semiconductor wafer may be set into motion as the wafer is forced against the pad. An abrasive, fluid-based chemical suspension, often referred to as a "slurry," may be deposited onto the surface of the polishing pad. The slurry fills the space between the polishing pad and the wafer surface such that a chemical in the slurry may react with the surface material being polished. The rotational movement of the polishing pad relative to the wafer causes abrasive particles entrained within the slurry to physically strip the reacted surface material from the wafer. Therefore, the CMP process may employ a combination of chemical stripping and mechanical polishing to form a planarized surface.

Unfortunately, a CMP process may not form a substantially planar surface across an entire semiconductor topography. For instance, the slurry may react in recessed regions, causing those regions to be excessively etched. Furthermore, the polishing rate of the CMP may be dependent upon the polish characteristics of the topography. In addition, the polishing pad, being somewhat conformal to the surface topography, may deform in response to polishing laterally adjacent layers comprising different polish properties. Therefore, while the removal rate of raised regions of the dielectric may be greater than that of the recessed regions in a typical CMP process, a significant amount of the recessed regions may, unfortunately, undergo removal. This phenomena is known as the "dishing" effect and may reduce the degree of planarization that can be achieved by the CMP process. In particular, the dishing effect may cause upper surfaces of layers and structures to curve below polished upper surfaces of adjacent structures or layers. For example, the dishing effect resulting from the fabrication of shallow trench isolation regions may be so severe that portions of the isolation regions may extend below the upper surface of the substrate. Consequently, the active regions of the device may not be adequately isolated.

In general, a topography having relatively wide regions of material may be more prone to the dishing effect than a topography having relatively narrow regions of material. As such, in an effort to reduce the dishing effect in topographies which have relatively wide regions of material, dummy structures are sometimes formed within the topography. In particular, structures which do not affect the functionality of a chip fabricated from the topography may be formed within the topography such that a substantially surface may be obtained. As a result, elevational fluctuations of the topography may be reduced and/or prevented. In general, dummy structures may be fabricated in a square pattern to simplify the layout design within an inactive region. In a preferred embodiment, the dummy structures may be arranged such that a particular plane of a topography has a substantially equal pattern density of components. In this manner, a substantially planar surface across the active and inactive regions of the topography may be obtained during a subsequent polishing process. In general, an active region of a topography may refer to the region of a topography designated for the formation of devices which are adapted to affect the functionality of a chip fabricated from the semiconductor topography. In contrast, an inactive region may refer to a region of the topography, such as an isolation structure, which does not include any devices which affect the functionality of a chip fabricated from the semiconductor topography.

In general, the number of structures that may be formed upon a topography, including those within the active and inactive regions of the topography, is typically limited by the memory space of the CAD system used to layout the chip and the computing power constraints of the system used to simulate the performance of such a chip layout. As such, in order to form active devices within the design specifications of a chip, the number of dummy structures fabricated within a topography is often limited. Such a limitation of the number of dummy structures typically results in fabricating structures with large dimensions relative to the critical dimensions of the devices within the active region of the topography. For instance, in many cases, dummy structures are fabricated with a square pattern of $7.2 \mu m \times 7.2 \mu m$, while devices within active regions include sub-micron dimensions. Such large dummy structures, however, may still be susceptible to the dishing effect, resulting in the formation of a non-planar surface subsequent to a polishing process. In some cases, structures and layers formed above such a non-planar surface may not be formed within design specifications of the chip, causing the chip to malfunction or rendered inoperable. As a result, the reliability and production yield of devices fabricated from such a process may be undesirably low. Such a problem may become even more significant as dimensions of active devices within a topography continue to decrease with the advancement of integrated circuit technology.

As such, it would be advantageous to develop a dummy structure layout which allows a substantially planar surface to be formed across a die and/or wafer having active devices with sub-micron critical dimensions. More specifically, it would be beneficial to develop a dummy structure layout which allows a topography to have regions with substantially similar dimensions and pattern densities across the entirety of the topography without exceeding the memory space and computing power constraints of the systems used to layout the chip design and simulate the performance of the chip, respectively.

SUMMARY OF THE INVENTION

The problems outlined above may be in large part addressed by a dummy structure layout which includes a pattern of similarly sized and uniformly spaced annular dummy structures for an inactive region of a semiconductor topography. In some cases, such a dummy structure layout may be used to outline a pattern of isolation structures subsequently formed within a semiconductor substrate of the inactive region. More specifically, the dummy structure layout may be used to form isolation structures spaced from each other within the inactive region of the semiconductor topography. In this manner, the pattern density of the semiconductor topography may become more evenly balanced relative to a topography in which a single isolation structure is formed within the entirety of the inactive region. In some cases, the pattern density of a semiconductor topography within a plane extending between the semiconductor substrate and a first interconnect line of a semiconductor topography may be substantially equal due to the use of the dummy structure layout described herein. In general, the active region of the semiconductor topography may refer to a region designated for the formation of features which are adapted to affect the functionality of a chip fabricated from the semiconductor topography. In contrast, an inactive region of the semiconductor topography may refer to a region which does not include any features which affect the functionality of a chip fabricated from the semiconductor topography.

A semiconductor topography is provided herein which includes a contiguous isolation structure configured in a grid pattern within a portion of a semiconductor substrate of the semiconductor topography and a separate isolation structure arranged within a spacing of the grid pattern within the semiconductor substrate. In general, the spacing between the contiguous isolation structure and the separate isolation structure may be less than approximately 1.0 micron. In some embodiments, the spacing between the contiguous isolation structure and the separate isolation structure may be substantially equal to a minimum critical dimension of features included within an active region of the semiconductor topography. In any case, the separate isolation structure may be one of a plurality of separate isolation structures individually arranged within spacings of the grid pattern within the semiconductor substrate. In addition or alternatively, a thickness variation of the contiguous isolation structure across the semiconductor topography may be less than approximately 10% of an average thickness of the contiguous isolation structure.

In some embodiments, the dummy structures may be removed subsequent to the formation of the isolation structures. In addition, the regions of the semiconductor substrate previously underlying the dummy structures may be introduced with dopants to form diffusion regions interposed between the isolation structures of the inactive region. As such, a semiconductor device is provided which includes an inactive region with a plurality of similarly sized and uniformly arranged annular diffusion regions. In addition, the inactive region may further include isolation structures individually surrounded by the annular diffusion regions. In general, the plurality of annular diffusion regions may include widths of less than approximately 1.0 micron. For example, in some cases, the plurality of annular diffusion regions may include widths substantially equal to a minimum critical dimension of features included within an active region of the semiconductor device.

In any case, the inactive region of the semiconductor topography described herein may include dummy structures other than the ones used to pattern the isolation structures. For example, the inactive region may include a conductive dummy structure arranged above one of the isolation structures of the inactive region. In this manner, the design layout for the inactive region may be adapted such that the conductive dummy structure may be formed upon an isolation structure. In particular, the design layout may be configured such that isolation regions formed within the semiconductor substrate may be large enough to receive subsequently formed dummy structures. Consequently, a semiconductor topography is provided which includes an inactive region with a sacrificial annular dummy structure configured to surround an area exclusively designated for a formation of an isolation structure within the semiconductor substrate of the semiconductor topography. Such an area is preferably larger than a square of a minimum critical dimension of the devices within the active region. In some cases, the conductive dummy structure may be arranged within the same horizontal plane as at least some of the features of the active region. In addition or alternatively, the conductive dummy structure may be one of a plurality of conductive dummy structures individually arranged above the isolation structures of the inactive region.

There may be several advantages to forming semiconductor topographies using the dummy structure layout described herein. For example, the pattern density of components across a semiconductor topography may be substantially equal. Consequently, the "dishing effect" of a polishing process may be reduced such that a substantially planar upper surface of a semiconductor topography may be formed. In this manner, overlying structures and layers may be formed within design specifications of a device formed therefrom. More specifically, step coverage problems and lithography problems may be minimized and patterning distorted structures and layers may be avoided. Consequently, production yield of chips fabricated from such topographies may be increased relative to topographies formed from conventional dummy structure layouts. In addition, the dummy structure layout described herein may reduce the amount of memory space used to design a chip layout as well as the computing power constraints of the system used to simulate the performance of such a chip. Furthermore, the time used to fabricate the mask used to form the isolation structures of the semiconductor topography may be reduced, reducing the cost of such a mask.

BRIEF DESCRIPTION OF THE DRAWINGS

Other objects and advantages of the invention will become apparent upon reading the following detailed description and upon reference to the accompanying drawings in which:

FIG. 7 depicts a partial cross-sectional view of the semiconductor topography in which the topography has been polished subsequent to the deposition of the fill layer in FIG. 6;

FIG. 8 depicts a partial cross-sectional view of the semiconductor topography in which the sacrificial layer has been removed subsequent to the polishing process of FIG. 7;

FIG. 9 depicts a partial cross-sectional view of the semiconductor topography in which exposed regions of the semiconductor substrate are introduced with dopants subsequent to the removal of the sacrificial layer in FIG. 8;

FIG. 10 depicts a partial top view of the semiconductor topography of FIG. 9;

Figure 1:
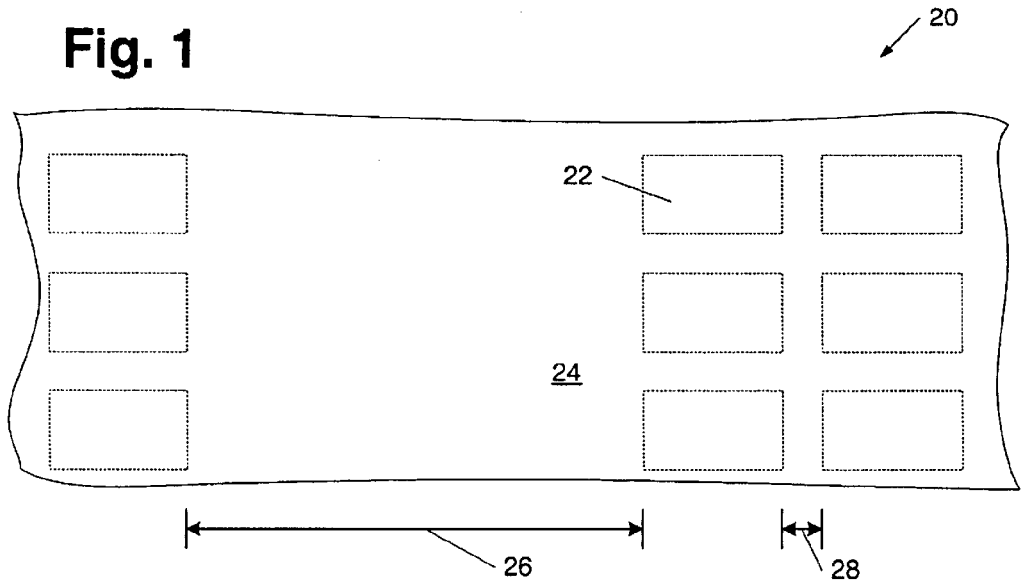
FIG. 1 depicts a top view of a partial design layout for the active and inactive regions of a semiconductor topography.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, an exemplary embodiment of a method for processing a semiconductor topography is shown in FIGS. 1–13. In particular, a method is provided which includes forming a plurality of dummy structures within an inactive region of the semiconductor topography such a substantially planar surface may be formed across the topography. As noted above, the active region of a semiconductor topography, as used herein, may refer to a region designated for the formation of features which are adapted to affect the functionality of a chip fabricated from the semiconductor topography. In contrast, an inactive region of a semiconductor topography may refer to a region which does not include any features which affect the functionality of a chip fabricated from the semiconductor topography.

FIG. 1 depicts a partial design layout for semiconductor topography 20, including active regions 22 and inactive regions 24. In particular, FIG. 1 illustrates active regions 22 outlined by dotted lines and inactive regions 24 comprising the portions of semiconductor topography 20 exterior to the dotted lines. In this manner, inactive regions 24 may occupy the regions of semiconductor topography 20 interposed between active regions 22. In some cases, however, inactive regions 24 may additionally or alternatively refer to regions arranged adjacent to active regions, but not necessarily interposed between active regions. In either embodiment, the inactive regions may refer to regions included within a chip fabricated from semiconductor topography 20. In yet other embodiments, however, inactive regions 24 may additionally or alternatively refer to regions of semiconductor topography 20 which are not to be fabricated into a chip. In particular, inactive regions 24 may include an outer edge region of a semiconductor wafer, which is not designated for the fabrication of active features, much less the fabrication of a chip.

Although FIG. 1 illustrates active regions 22 occupying portions of semiconductor topography 20 having substantially similar areas, active regions 22 are not limited to such dimensions. In particular, active regions 22 may vary in size and/or shape relative to each other. In addition, inactive regions 24 may also vary in size and/or shape relative to each other and their respective regions depicted in FIG. 1. It is noted that FIG. 1 merely illustrates a design layout of semiconductor topography 20 and, thus, active regions 22 and inactive regions 24 do not include layers or structures formed upon semiconductor topography 20. Rather, the formation of layers and structures within such regions is described below in reference to FIGS. 2–13. The focus of FIG. 1 is mainly to distinguish the regions of the topography which are designated for the formation of features which affect the functionality of a chip fabricated therefrom and the regions which are designated not to include such features.

As shown in FIG. 1, inactive regions 24 may occupy different sized portions of semiconductor topography 20. For example, inactive regions 24 may occupy wide region 26 and narrow region 28 as shown in FIG. 1. In addition, inactive regions 24 may occupy other portions of semiconductor topography 20, as described above. In any case, wide region 26 may refer to a portion of semiconductor topography 20 which is particularly susceptible to the "dishing effect," as described above in reference to polishing processes. Consequently, dummy structures may need to be fabricated within wide region 26 to reduce and/or eliminate the dishing effect. More specifically, dummy structures may need to be fabricated within wide region 26 such that the pattern density of components having different material characteristics within semiconductor topography 20 may be substantially equal. Narrow region 28, on the other hand, may not be as susceptible to the dishing effect since the width of the region is particularly small and, therefore, may not need to have dummy structures fabricated therein.

In general, the size of an inactive region to have dummy structures fabricated therein in an effort to reduce and/or eliminate the dishing effect of a polishing process may depend upon the critical dimensions of the features subsequently fabricated within the active regions of the semiconductor topography. For example, a device comprising active features having minimum critical dimensions of approximately 0.14 $\mu$m may need dummy structures formed within inactive regions comprising widths greater than or equal to approximately 0.5 $\mu$m in order to reduce and/or eliminate the dishing effect of a polishing process. As critical dimensions of active features continue to decrease, however, the size of inactive regions needing dummy structures continues to decrease. As such, the size of wide region 26 and narrow region 28, as well as active regions 22, may depend on the technology of the chip fabricated therefrom.

Figure 2:
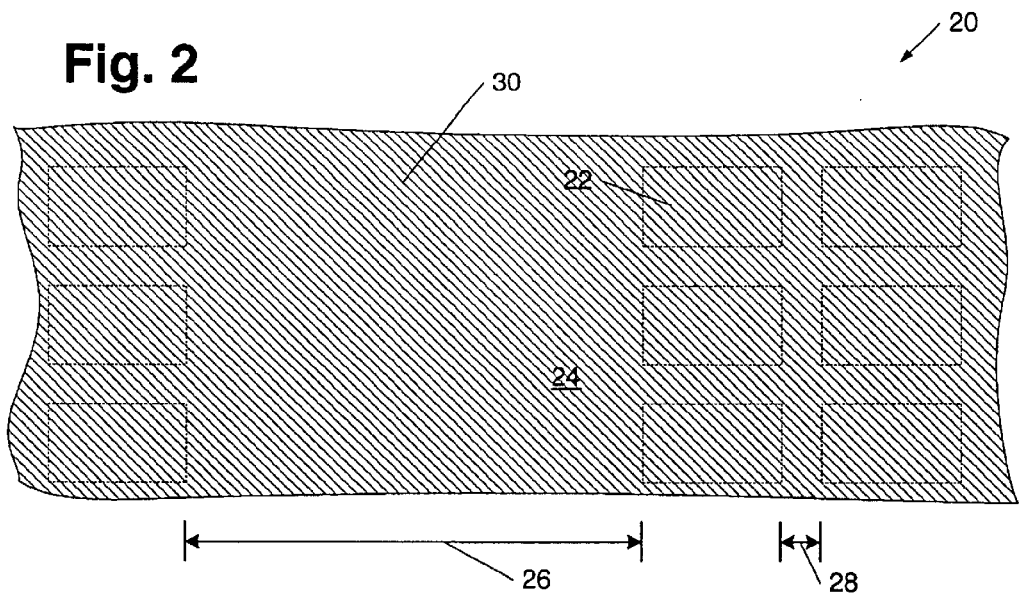
FIG. 2 depicts a partial top view of a semiconductor topography in which a sacrificial layer is formed upon a semiconductor substrate of FIG. 1.
Figure 3:
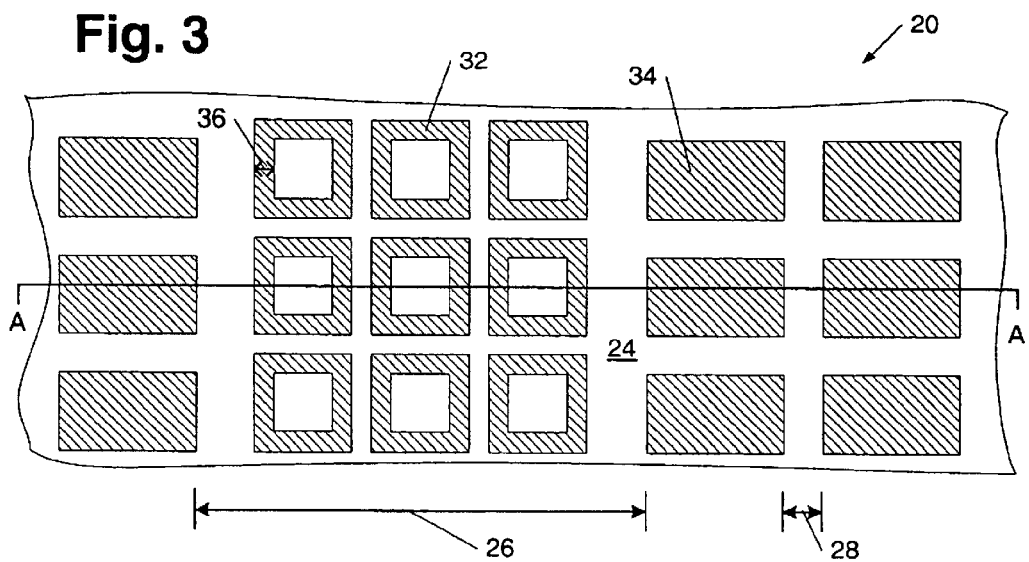
FIG. 3 depicts a partial top view of the semiconductor topography in which the sacrificial layer is patterned to form dummy structures subsequent to the layer formation in FIG. 2.

As described below, FIGS. 2 and 3 illustrate the fabrication of dummy structures within wide region 26. Although FIGS. 2 and 3 are used to describe the fabrication of dummy structures solely within wide region 26, the method and semiconductor topographies described herein are not restricted to such a design. In particular, dummy structures may be fabricated within any portion of inactive regions 24 large enough to accommodate the dummy structures. In addition, although the dummy structures described in reference to FIG. 3 are shown to include a specific design layout, the entirety of wide region 26 does not necessarily need to include dummy structures with the same configuration. Alternatively stated, a portion of wide region 26 may include a different dummy structure pattern than the pattern described in reference to FIG. 3. Likewise, dummy structures of different design layouts may be included within other portions of inactive regions 24. In yet other embodiments, the entirety of wide region 26 and/or other portions of inactive regions 24 may include the same dummy structure pattern, including but not limited to the layout described in reference to FIG. 3.

FIG. 2 illustrates the formation of layer 30 upon the upper surface of semiconductor topography 20. Active regions 22 and inactive regions 24 are illustrated in FIG. 2, as in FIG. 1, to indicate the portions of the topography designated for the formation of active features and the portions designated for the absence of active features, respectively. As such, the reference of active regions 22 and inactive regions 24 in FIG. 2 do not indicate the presence of actual structures and layers, but rather the regions that structures and layers may be subsequently fabricated within. In general, layer 30 may serve to protect underlying portions semiconductor topography 20. For example, layer 30 may protect portions of semiconductor layer 38 from an etch process which may be used to form trenches within semiconductor topography 20 as described in more detail below in reference to FIG. 5.

Figure 6:
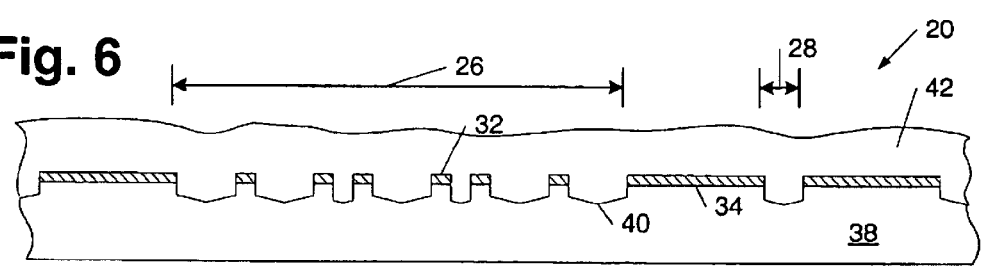
FIG. 6 depicts a partial cross-sectional view of the semiconductor topography in which a fill layer is deposited upon the topography subsequent to the trench formation of FIG. 5.

In some embodiments, layer 30 may include a dielectric material with different material characteristics than fill layer 42, which is described in more detail below in reference to FIG. 6. For instance, layer 30 may include a material which has different compressibility characteristics than fill layer 42. In this manner, the polishing pad, being somewhat conformal to the semiconductor topography, may be less susceptible to deformation. In addition or alternatively, layer 30 may include a material which polishes at a slower rate than that of fill layer 42. In this manner, layer 30 may serve as a polish stop layer. For example, layer 30 may include a material, such as silicon dioxide ($SiO_2$), silicon nitride ($S_3N_4$), silicon oxynitride ($SiO_xN_y(H_z)$), or silicon dioxide/silicon nitride/silicon dioxide (ONO). In some embodiments, layer 30 may include silicon nitride since it is a relatively hard material, particularly compared to silicon dioxide and monocrystalline silicon. In such an embodiment, however, a "pad" oxide layer may be interposed between semiconductor topography 20 and the nitride layer to reduce inherent stresses between nitride and silicon. In any case, the thickness of layer 30 may generally be between approximately 100 angstroms and approximately 400 angstroms. However, larger and smaller thicknesses may be used for layer 30, depending on the design specifications of the device.

As illustrated in FIG. 3, layer 30 may be patterned to form dummy structures 32 within inactive regions 24 and portions 34 within active regions 22. Such a patterning process may include any lithography technique known in the semiconductor fabrication industry. The design layout of dummy structures 32 and portions 34 may designate the portions of semiconductor topography 20 in which isolation structures will not be formed. Alternatively stated, the design layout illustrated in FIG. 3 may define the boundaries of isolation structures subsequently formed within semiconductor topography 20. As shown in FIG. 3, portions 34 may occupy the entirety of active regions 22. In this manner, active regions 22 may include features which are adapted to affect the functionality of a chip fabricated therefrom.

In general, dummy structures 32 may be adapted to form a substantially equal pattern density of occupied portions and unoccupied portions across the topography. In this manner, an insulating layer may be formed within the unoccupied portions to form a substantially equal pattern density of components having different polishing characteristics across semiconductor topography 20. Consequently, a substantially planar surface may be formed across semiconductor topography 20. As such, dummy structures 32 may be configured to occupy a similar amount of space as a number of active regions arranged within an area of the semiconductor topography which is similar to wide region 26. In addition, dummy structures 32 may be spaced apart by a dimension that minimizes the generation of the dishing effect across a topography. For instance, in some cases, dummy structures 32 may be spaced apart by less than approximately 0.5 $\mu$m. Such a dimension, however, is generally proportional to the critical dimensions of the devices within the active region of the topography. Consequently, as critical dimensions of active devices continue to decrease with the advancement of integrated circuit technology, the spacing of dummy structures may continue to decrease.

As stated above, dummy structures 32 may be adapted to occupy portions of semiconductor topography 20 such that a substantially equal pattern density of occupied portions and unoccupied portions across the topography may be formed. For example, in some cases, dummy structures 32 may be configured in an annular shape, as shown in FIG. 3. In such a case, the annular shape is preferably configured to exclusively surround an isolation structure subsequently formed upon semiconductor topography 20. In some embodiments, dummy structures 32 may be configured to surround an isolation structure which is larger than a square of a minimum critical dimension of the features subsequently formed within active regions 22. Such an embodiment is described in more detail below in reference to FIG. 12.

In any case, dummy structures 32 may be sized such that the number of dummy structures within wide region 26 does not exceed the memory space and/or power constraints of the systems used for the design layout of a chip fabricated from semiconductor topography 20 and simulation of the chip performance, respectively. For example, in some cases, dummy structures 32 may have width 36 which is less than approximately 1.0 micron. In some embodiments, it may be advantageous for width 36 to be substantially equal to the minimum critical dimension of the features subsequently formed within active regions 22. In particular, fabricating dummy structures 32 with such a dimension may advantageously allow greater flexibility in the design layout of dummy structures 32. More specifically, fabricating dummy structures 32 to have a width which is substantially similar to the minimum critical dimension of the features subsequently formed within active regions 22 may broaden the specifications of other dimensions of the dummy structures. For example, the outer circumference of dummy structures 32 may have a broader dimension specification when width 36 is comparable to the minimum critical dimension features subsequently formed within active regions 22.

As such, although FIG. 3 illustrates dummy structures 32 patterned in a square formation, dummy structures 32 may alternatively be configured in other shapes, such as circles, triangles, rectangles or any polygonal shape. In addition, although dummy structures 32 are shown to have substantially similar dimensions and are uniformly arranged within wide region 26, the dummy structure layout described herein is not restricted to such a configuration. In particular, dummy structures 32 may alternatively be dispersed across wide region 26 in a non-uniform manner. In addition or alternatively, the dimensions of dummy structures 32 may differ. Patterning dummy structures 32 in a uniform manner and with substantially similar dimensions, however, may advantageously reduce the memory space of the CAD system used to layout the design of the chip. In particular, fabricating dummy structures 32 with substantially uniform dimensions and in a uniform manner may allow dummy structures 32 to be fabricated in a repeatable pattern, reducing the complexity of the chip layout.

Figure 4:
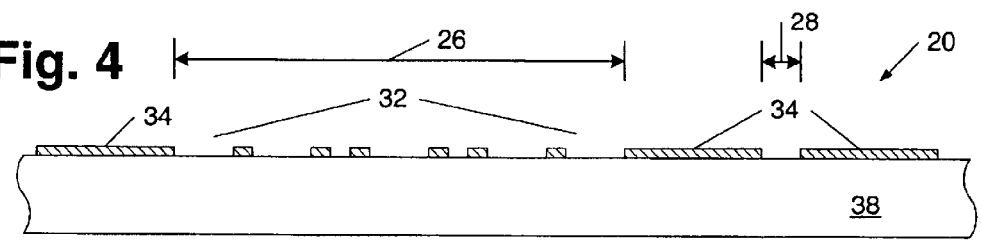
FIG. 4 depicts a partial cross-sectional view of the semiconductor topography along line AA of FIG. 3.

A partial cross-sectional view of semiconductor topography 20 taken along line AA in FIG. 3 is illustrated in FIG. 4. In particular, FIG. 4 illustrates dummy structures 32 and portions 34 patterned upon semiconductor layer 38. In a preferred embodiment, semiconductor layer 38 may be a semiconductor substrate such as, a monocrystalline silicon substrate. Alternatively, semiconductor layer 38 may include structures and layers formed upon a semiconductor substrate. The structures and layers may include, but are not limited to, gate dielectric layers, gate structures, contact structures, local interconnect wires, additional dielectric layers, or metallization layers. As stated above, in some embodiments, an oxide layer (not shown) may be interposed between semiconductor layer 38 and dummy structures 32 and/or portions 34 in an embodiment in which layer 38 comprises silicon nitride. Such an oxide layer may serve to reduce the inherent stresses between silicon nitride and silicon.

Figure 5:
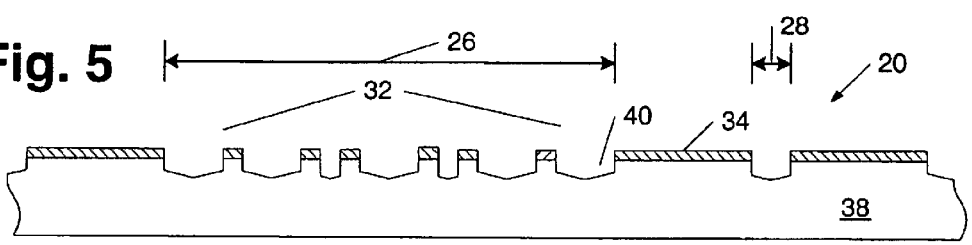
FIG. 5 depicts a partial cross-sectional view of the semiconductor topography following FIG. 4 in which trenches are etched into exposed portions of the semiconductor substrate subsequent to the formation of the dummy structures described in reference to FIG. 3.

As shown in FIG. 5, portions of semiconductor layer 38 may be etched away to define trenches 40. Similar to the patterning process described in reference to FIG. 3, trenches 40 may be patterned using a lithography technique known in the semiconductor fabrication industry. In some embodiments, layer 30 and semiconductor layer 38 may be etched simultaneously. Consequently, in some embodiments, the steps described in reference to FIGS. 3 and 5 may be combined. In general, trenches 40 may be formed at depths which are in accordance with the design specifications of the integrated circuit. For example, in some embodiments, the depth of trenches 40 below the upper surface of semiconductor layer 38 may be between approximately 3000 angstroms and approximately 4000 angstroms. Larger or smaller trench depths, however, may be appropriate, depending on the design specifications of the device. It is noted that the components of semiconductor topography 20 are not necessarily drawn to scale in FIGS. 1–13. For instance, the depth of trenches 40 in FIG. 5 may be on the order of thousands of angstroms, while the thickness of dummy structures 32 and portions 34 may be on the order of hundreds of angstroms.

As stated above, dummy structures 32 and portions 34 may be used to form isolation structures within semiconductor topography 20, in some embodiments. In particular, a fill layer may be deposited within trenches 40 to subsequently form shallow trench isolation regions within semiconductor layer 38. Turning to FIG. 6, fill layer 42 is shown deposited within trenches 40 and upon upper surfaces of dummy structures 32 and portions 34. In a preferred embodiment, fill layer 42 may be deposited to a level such that the entirety of the upper surface of the fill layer is spaced above dummy structures 32 and portions 34. Forming fill layer 42 to such a thickness allows semiconductor topography 20 to be subsequently polished to a substantially planar surface with dummy structures 32 and portions 34.

As noted above, fill layer 42 may include a material with different polishing characteristics than that of layer 30. For example, fill layer 42 may include a dielectric material such as, silicon dioxide ($SiO_2$), silicon oxynitride ($SiO_xN_y(H_z)$), silicon carbide, or carbonated polymers when layer 30 includes silicon nitride. Alternatively, fill layer 42 may be formed from a low-permittivity ("low-k") dielectric, generally known in the art as a dielectric having a dielectric constant of less than about 3.5. One low-k dielectric in current use, which is believed to make a conformal film, is fluorine-doped silicon dioxide. Fill layer 42 may also be undoped or may be doped to form, for example, low doped borophosphorus silicate glass (BPSG), low doped phosphorus silicate glass (PSG), or fluorinated silicate glass (FSG). Low doped BPSG may have a boron concentration of less than approximately 5% by weight. Low doped PSG may have a phosphorus concentration of less than approximately 10% by weight, and more preferably less than approximately 5% by weight.

Subsequent to deposition of fill layer 42, semiconductor topography 20 may be polished. In some embodiments, fill layer 42 may be polished to a level spaced above dummy structures 32 and portions 34. In yet other embodiments, fill layer 42 may be polished to expose dummy structures 32 and portions 34 as illustrated in FIG. 7. In this manner, polishing fill layer 42 may include polishing the upper portion of semiconductor topography 20 such that remaining portions of fill layer 42 are laterally confined by sidewalls of trenches 40, forming shallow isolation structures 44. Since the pattern of dummy structures 32 is adapted to form a substantially equal pattern density of components having different polishing characteristics, the dishing effect within isolation structures 44 may be negligible or non-existent. Consequently, isolation structures may be formed with substantially planar upper surfaces, allowing overlying structures and layers to be formed within design specifications of the device. In particular, the thickness variation of isolation structures 44 may be less than approximately 10% of the average thickness of the isolation structures, or more preferably by less than approximately 5%. In some embodiments, the thickness variation between isolation structures 44 by differ less than approximately 250 angstroms, and more preferably by less than approximately 200 angstroms.

Subsequent to the polishing process, dummy structures 32 and portions 34 may be removed as shown in FIG. 8. Such a removal may include any stripping process known in the semiconductor fabrication industry, including wet and/or dry etch techniques. In some cases, the removal process may further include a selective etch to remove a pad oxide arranged underneath dummy structures 32 and portions 34. Although the removal of dummy structures 32 and portions 34 causes isolation structures 44 to be raised above the upper surface of semiconductor layer 38 slightly, such a step height may be nominal and, therefore, is generally not considered to affect the planarity of overlying layers and/or structures as described in more detail below reference to FIGS. 12 and 13. In particular, the step height of isolation structures 44 extending above the upper surface of semiconductor layer 38 may be between approximately 50 angstroms and approximately 150 angstroms.

As shown in FIG. 9, dopants 46 may be introduced into exposed portions of semiconductor layer 38 to form diffusion regions 48 and 50. In general, dopants 46 may include p-type or n-type dopants, depending on the design specifications of the device. A partial top view of semiconductor topography 20 subsequent to the introduction of dopants 46 is shown in FIG. 10. In particular, FIG. 10 shows diffusion regions 48 formed within the entirety of active regions 22. During subsequent processing, a plurality of features may be formed above diffusion region 48 such that devices which affect the functionality of an integrated circuit formed therefrom may be formed. FIG. 10 also illustrates diffusion regions 50 formed within wide region 26 of inactive regions 24. In general, diffusion regions 50 may differ from diffusion regions 48 in that no active features will be subsequently formed upon diffusion regions 50. In this manner, wide region 26 may function as an inactive region.

In general, the configuration of diffusion regions 50 may simulate the configuration of dummy structures 32. As such, FIG. 10 shows wide region 26 including a plurality of similarly sized and uniformly arranged annular diffusion regions. In addition, FIG. 10 shows wide region 26 including a plurality of isolation structures surrounded by the annular diffusion regions. Moreover, diffusion regions 50 may generally include widths which are less than approximately 1.0 micron. For example, in some embodiments, diffusion regions 50 may include widths which are substantially equal to a minimum critical dimension of the active features subsequently formed within active regions 22. Alternatively, however, diffusion regions 50 may be formed with larger or smaller dimensions and/or patterned in configurations other than the one shown in FIG. 10. In particular, diffusion regions 50 may be formed with different dimensions from each other and/or in patterned in a non-uniform manner.

Figure 11:
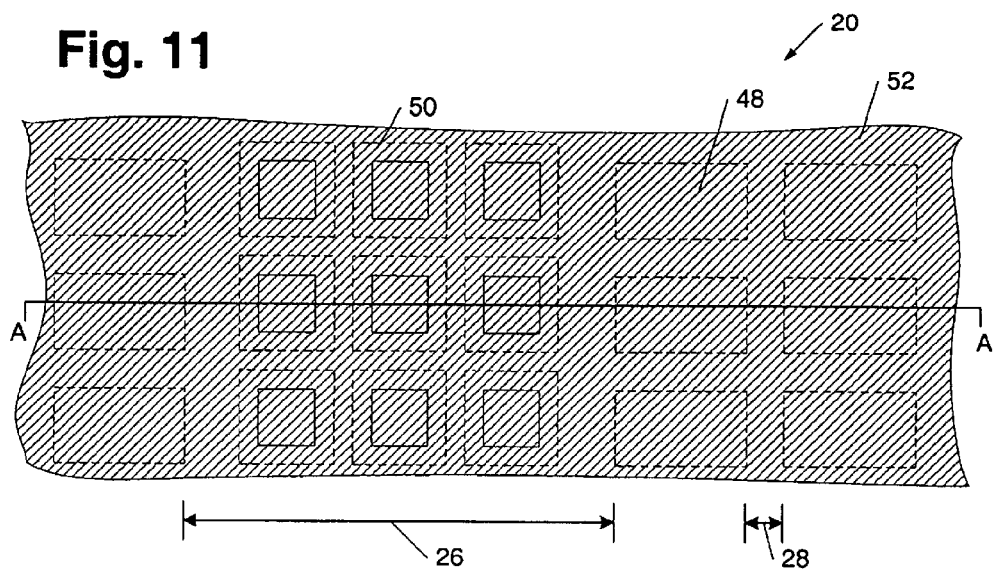
FIG. 11 depicts a partial top view of the semiconductor topography in which a conductive layer is deposited upon the topography illustrated in FIG. 10.

In some cases, dummy structures 32 may be patterned in a configuration which allows for the formation of additional dummy structures above isolation structures 44 within wide region 26. In particular, dummy structures 32 may be patterned to surround an area larger than a square of a minimum critical dimension of the features formed within action regions 22. Such a process is described in more detail below in reference to FIGS. 11–13. In particular, FIG. 11 illustrates a partial top view of semiconductor topography 20 in which conductive layer 52 has been deposited upon isolation structures 44 and diffusion regions 48 and 50. Diffusion regions 48 and 50 are outlined by dotted lines to illustrate their relative positions underlying conductive layer 52. In general, conductive layer 52 may include any conductive material, such as but not limited to, doped polysilcon, aluminum, copper, titanium, tungsten, and any metal alloys or silicides thereof. In addition, the thickness of conductive layer 52 may be between approximately 1000 angstroms and approximately 4000 angstroms. Larger or smaller thickness of conductive layer, however, may be fabricated depending on the design specifications of the device.

Figure 12:
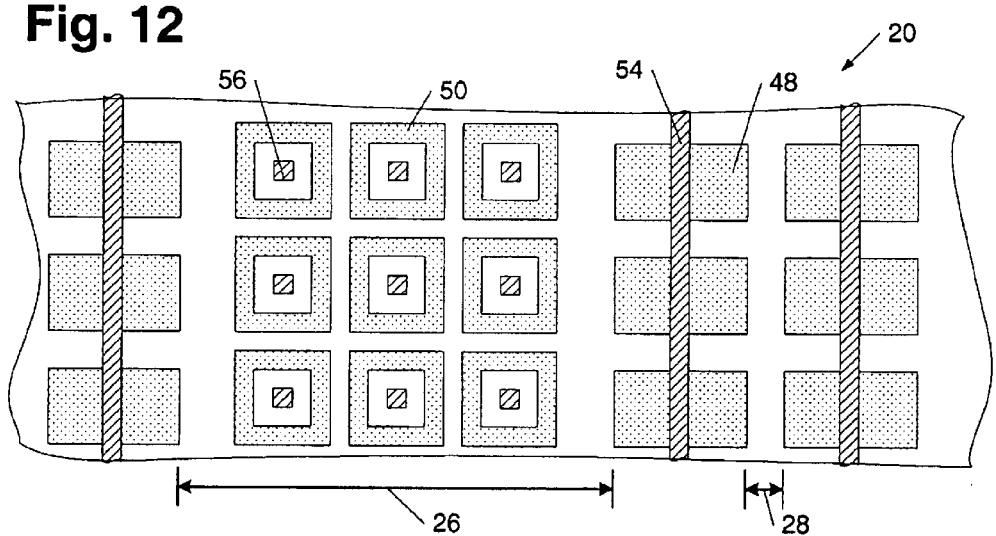
FIG. 12 depicts a partial top view of the semiconductor topography in which the conductive layer is patterned subsequent to the deposition of the conductive layer in FIG. 11.

As shown in FIG. 12, conductive layer 52 may be patterned to form gate structure lines 54 and dummy structures 56. In particular, conductive layer 52 may be patterned to extend gate structure lines 54 across active regions 22 such that a plurality of active devices may be fabricated therefrom. In addition, conductive layer 52 may be patterned to form dummy structures 56 above isolation structures 44 formed within wide region 26. In general, dummy structures 56 may be configured in any shape, such as a circle, square, rectangle, triangle, or any polygonal shape. In some cases, dummy structures 56 may be configured in shape which is similar to the underlying isolation structure. In yet other embodiments, dummy structures 56 may be configured in a shape which is different than the shape of the underlying isolation structure. In any case, the arrangement of dummy structures 56 on isolation structures 44 within wide region 26 may allow a substantially planar surface to be formed during a polishing process of a layer formed above gate structure lines 54 as described below in reference to FIG. 13.

In general, dummy structures 56 may be sized such that the entirety of the dummy structures are arranged over isolation structures 44 within wide region 26. As such, in some cases, dummy structures 56 may include dimensions which are slightly smaller than the dimensions of the underlying isolation structures. In some embodiments, dummy structures 56 may include a dimension which is substantially similar to the minimum critical dimension of the features within active regions 22. As such, in some cases, isolation structures 44 within wide region 26 may be formed to include an area larger than a square of the minimum critical dimension of the features within active regions 22. Typically, gate structure lines govern the minimum critical dimension of an active device within an integrated circuit. More specifically, the widths of gate structure lines typically govern the minimum critical dimension of an active device. As such, in some cases, dummy structures 56 may include a width which is substantially similar to the width of gate structure lines 54. In yet other embodiments, however, dummy structures 56 may include a width which is larger than the minimum critical dimension of the features within active regions 22.

Figure 13:
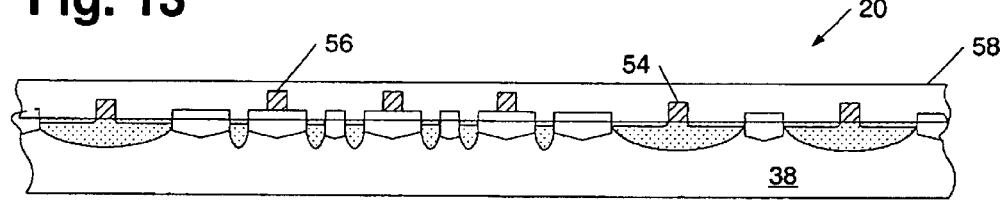
FIG. 13 depicts a partial cross-sectional view of the semiconductor topography in which an interlevel dielectric is deposited and polished subsequent to the patterning of the conductive layer in FIG. 12.

FIG. 13 depicts a cross-sectional view of semiconductor topography 20 along line AA of FIG. 12 subsequent to the deposition and planarization of dielectric 58. As shown in FIG. 13, dielectric 58 may be polished to a level above gate structures lines 54 and dummy structures 56 in order to avoid creating a short with subsequently formed overlying conductive layers and structures. As such, the polishing process of dielectric 58 may differ from the polishing process of a material, such as fill layer 42, which is used to form isolation structures. In particular, dummy structures 56 may not be used as an etch stop for the polishing process of dielectric 58, but rather may be used to absorb the pressures applied to a given region during the polishing process. In this manner, although dummy structures 56 may be used in a different manner than dummy structures 32, a substantially planar surface may be obtained from the use of dummy structures 56 during the polishing process. In other words, the portion of dielectric 58 within wide region 30 may be void of the dishing effect. In particular, the thickness variation of dielectric 58 extending from the upper surface of dummy structures 56 and the upper surface of dielectric 58 may be less than approximately 10%, or more preferably by less than approximately 5%.

It will be appreciated to those skilled in the art having the benefit of this disclosure that this invention is believed to provide a dummy structure layout for fabricating a substantially planar surface within an inactive region of a semiconductor topography. Further modifications and alternative embodiments of various aspects of the invention will be apparent to those skilled in the art in view of this description. For example, the dummy structure pattern described herein could be applied not just to forming a substantially planar surface within an inactive region extending between a substrate and a first interconnect layer, but to forming a substantially planar surface within any planar region within a semiconductor topography. In addition, the dummy structure design layout described herein may be used during the fabrication of a chip of any critical dimension, including those equal to and less than approximately 0.1 μm. It is intended that the following claims be interpreted to embrace all such modifications and changes and, accordingly, the drawings and the specification are to be regarded in an illustrative rather than a restrictive sense.

What is claimed is:

1. A semiconductor topography, comprising:
an active region designated for a formation of devices which are adapted to affect the functionality of a chip fabricated from the semiconductor topography; and
an inactive region comprising a sacrificial annular dummy structure configured to surround an area larger than a square of a minimum critical dimension of the devices, wherein the area is exclusively designated for a formation of an isolation structure within the semiconductor substrate of the semiconductor topography.

2. The semiconductor topography of claim 1, wherein the sacrificial annular dummy structure is one of a plurality of sacrificial annular dummy structures having substantially similar dimensions.

3. The semiconductor topography of claim 1, wherein the sacrificial annular dummy structure is one of plurality of sacrificial dummy structures uniformly arranged throughout the inactive region.

4. The semiconductor topography of claim 1, wherein the sacrificial dummy structure comprises a width less than approximately 1.0 micron.

5. The semiconductor topography of claim 3, wherein the sacrificial dummy structure comprises a width substantially equal to the minimum critical dimension of the devices.

6. The semiconductor topography of claim 2, wherein the plurality of sacrificial annular dummy structures are configured to form a pattern density of occupied portions and unoccupied portions across the semiconductor topography.

7. A semiconductor device comprising an inactive region with a plurality of similarly sized and uniformly arranged annular diffusion regions.

8. The semiconductor device of claim 7, wherein the plurality of annular diffusion regions comprise widths of less than approximately 1.0 micron.

9. The semiconductor device of claim 7, further comprising an active region comprising a plurality of features adapted to affect the functionality of the device.

10. The semiconductor device of claim 9, wherein the plurality of annular diffusion regions comprise widths substantially equal to a minimum critical dimension of the features.

11. The semiconductor device of claim 9, wherein the inactive region further comprises isolation structures individually surrounded by the annular diffusion regions.

12. The semiconductor device of claim 11, wherein the inactive region further comprises a conductive dummy structure arranged above one of the isolation structures.

13. The semiconductor device of claim 12, wherein the conductive dummy structure is arranged within the same horizontal plane as at least some of the features of the active region.

14. The semiconductor device of claim 12, wherein the conductive dummy structure is one of a plurality of conductive dummy structures individually arranged above the isolation structures.

15. A semiconductor topography, comprising:
a contiguous isolation structure configured in a grid pattern within a portion of a semiconductor substrate of the semiconductor topography; and
a separate isolation structure arranged within a spacing of the grid pattern within the semiconductor substrate.

16. The semiconductor topography of claim 15, further comprising a conductive dummy structure arranged above the separate isolation structure.

17. The semiconductor topography of claim 15, wherein the separate isolation structure is one of a separate isolation structures individually arranged within spacings of the substrate.

18. The semiconductor topography of claim 15, wherein a spacing between the contiguous isolation structure and the separate isolation structure is less than approximately 1.0 micron.

19. The semiconductor topography of claim 15, further comprising an active region designated for the formation of a plurality of features adapted to affect the functionality of a chip fabricated from the semiconductor topography, wherein a spacing between the contiguous isolation structure and the separate isolation structure is substantially similar to a minimum critical dimension of the features.

20. The semiconductor topography of claim 15, wherein a thickness variation of the contiguous isolation structure across the semiconductor topography is less than approximately 10% of an average thickness of the contiguous isolation structure.

* * * * *

UNITED STATES PATENT AND TRADEMARK OFFICE
CERTIFICATE OF CORRECTION

PATENT NO. : 6,833,622 B2
DATED : December 21, 2004
INVENTOR(S) : Zagrebelny et al.

It is certified that error appears in the above-identified patent and that said Letters Patent is hereby corrected as shown below:

Title page,
Item [74], *Attorney, Agent, or Firm*, delete "Mollie F. Leitang" and substitute -- Mollie E. Lettang --.

Column 14,
Line 27, after "structure is one of a" insert -- plurality of --.
Line 28, after "within spacings of the" insert -- grid pattern within the semiconductor --.

Signed and Sealed this

Twenty-fourth Day of January, 2006

JON W. DUDAS
*Director of the United States Patent and Trademark Office*